United States Patent
Lashina et al.

(10) Patent No.: US 10,299,353 B2
(45) Date of Patent: May 21, 2019

(54) METHODS FOR INITIATING STATE MACHINES IN RESPONSE TO TOUCH EVENTS DETECTED AT HOME APPLIANCES

(71) Applicant: SIGNIFY HOLDING B.V., Eindhoven (NL)

(72) Inventors: Tatiana Aleksandrovna Lashina, Eindhoven (NL); Philip Steven Newton, Waalre (NL); Bartel Marinus Van De Sluis, Eindhoven (NL); Dzmitry Viktorovich Aliakseyeu, Eindhoven (NL); Dirk Valentinus René Engelen, Heusden-Zolder (BE); Tim Dekker, Eindhoven (NL)

(73) Assignee: SIGNIFY HOLDING B.V., Eindhoven (NL)

(*) Notice: Subject to any disclaimer, the term of this patent is extended or adjusted under 35 U.S.C. 154(b) by 0 days.

(21) Appl. No.: 15/301,242

(22) PCT Filed: Feb. 9, 2015

(86) PCT No.: PCT/IB2015/050959
§ 371 (c)(1),
(2) Date: Sep. 30, 2016

(87) PCT Pub. No.: WO2015/150927
PCT Pub. Date: Oct. 8, 2015

(65) Prior Publication Data
US 2017/0019978 A1    Jan. 19, 2017

Related U.S. Application Data

(60) Provisional application No. 61/974,018, filed on Apr. 2, 2014.

(51) Int. Cl.
*H05B 33/08*     (2006.01)
*H05B 37/02*     (2006.01)
(Continued)

(52) U.S. Cl.
CPC ......... *H05B 37/0272* (2013.01); *G06F 3/044* (2013.01); *G06F 3/0416* (2013.01); *H03K 17/962* (2013.01); *H05B 37/0227* (2013.01)

(58) Field of Classification Search
CPC ............... H05B 37/02; H05B 37/0272; H05B 37/0227; H05B 37/029; H05B 37/0245; Y02B 20/48; Y02B 20/186; F21V 23/0442
(Continued)

(56) References Cited

U.S. PATENT DOCUMENTS

2005/0174777 A1* 8/2005 Cooper ............... F21V 23/0442
                                                       362/276
2011/0050132 A1* 3/2011 Hooijer ................. H05B 37/02
                                                       315/297
(Continued)

FOREIGN PATENT DOCUMENTS

CN      202488824 U    10/2012
EP       2675248 A2    12/2013
(Continued)

*Primary Examiner* — Dedei K Hammond
(74) *Attorney, Agent, or Firm* — Meenakshy Chakravorty

(57) ABSTRACT

Various inventive methods and apparatus disclosed herein relate to associating state machines with touch event profiles, and to initiating state machines in response to touch events detected at home appliances. In some embodiments, a touch event may be detected at a touch sensor associated with a home appliance (102, 102a). The home appliance may be operated to perform its primary function in response to the detected touch event. It may be determined whether the touch event satisfies a predetermined touch event profile. A state machine may be operated at a computing device
(Continued)

(102*a*, 112, 330) remote from the home appliance in response to the determining.

20 Claims, 5 Drawing Sheets

(51) Int. Cl.
    *G06F 3/041*     (2006.01)
    *G06F 3/044*     (2006.01)
    *H03K 17/96*     (2006.01)

(58) Field of Classification Search
    USPC ............... 315/297, 153, 210; 362/227, 276; 340/3.1
    See application file for complete search history.

(56) References Cited

U.S. PATENT DOCUMENTS

| | | |
|---|---|---|
| 2012/0299485 A1 | 11/2012 | Mohan et al. |
| 2013/0200811 A1* | 8/2013 | Steininger ............ H05B 37/02 315/159 |
| 2013/0221853 A1 | 8/2013 | Chang et al. |
| 2014/0239844 A1* | 8/2014 | Bruwer ............ H05B 33/0863 315/292 |
| 2016/0037611 A1* | 2/2016 | Min .................. H05B 33/0842 315/152 |
| 2016/0174025 A1* | 6/2016 | Chaudhri ............... H04W 4/02 455/41.1 |

FOREIGN PATENT DOCUMENTS

| | | |
|---|---|---|
| JP | 2003243189 A2 | 8/2003 |
| JP | 2010157820 A2 | 7/2010 |
| WO | 2009136324 A1 | 11/2009 |
| WO | 2010035179 A2 | 4/2010 |
| WO | 2013085600 A2 | 6/2013 |

* cited by examiner

METHODS FOR INITIATING STATE MACHINES IN RESPONSE TO TOUCH EVENTS DETECTED AT HOME APPLIANCES

CROSS-REFERENCE TO PRIOR APPLICATIONS

This application is the U.S. National Phase application under 35 U.S.C. § 371 of International Application No. PCT/IB2015/050959, filed on Feb. 9, 2015, which claims the benefit of United States Patent Application No. 61/974, 018, filed on Apr. 2, 2014. These applications are hereby incorporated by reference herein.

TECHNICAL FIELD

The present invention is directed generally to touch-controlled and/or networked home appliances. More particularly, various inventive methods and apparatus disclosed herein relate to initiating state machines in response to touch events detected at home appliances.

BACKGROUND

Networked home appliances such as luminaires and/or lighting units may be controlled with mobile computing devices such as smart phones, tablet computers and/or wearable computing devices such as smart glasses, smart watches, and so forth. However, a user may not always have her mobile computing devices handy when she wishes to change a lighting setting of a luminaire. Additionally, the fact that many home appliances are (at least in some fashion) capable of communication opens up myriad possibilities for potential applications that could be tied to operation of those home appliances. Thus, there is a need in the art to leverage the communication capabilities of various home appliances to perform a variety of tasks and applications, including lighting control.

SUMMARY

The present disclosure is directed to inventive methods and apparatus for to initiating one or more state machines in response to one or more touch events detected at home appliances. For example, a touch-controlled luminaire (e.g., that is built to be touch controlled or has a separate touch sensor installed) may be operated to not only control lighting of the luminaire, but to also initiate various state machines at remote computing devices such as smart phones, lighting system bridges, and so forth. A mobile computing device such as a smart phone may be operated to associate a predetermined touch event profile with one or more state machines to be initiated at a smart phone, a lighting system bridge, or another remote computing device.

Generally, in one aspect, A method may include comprising: detecting, at a touch sensor associated with a home appliance, a touch event; operating the home appliance to perform its primary function in response to the detecting; determining that the touch event satisfies a predetermined touch event profile; and initiating a state machine at a computing device remote from the home appliance in response to the determining.

In various embodiments, initiating the state machine comprises issuing, by a controller associated with the touch sensor over a network in response to the determining, an instruction to initiate the state machine. In various versions, the home appliance comprises a luminaire, and the issuing comprises transmitting one or more instructions to one or more other luminaires. In various versions, the transmitting comprises transmitting using ZigBee, radio frequency communication, or coded light. In various versions, the issuing comprises transmitting the instruction to a lighting system bridge. In various versions, the issuing comprises transmitting the instruction to a mobile computing device.

In various embodiments, the home appliance comprises a luminaire, and operating the home appliance to perform its primary function comprises energizing one or more light sources installed in the luminaire. In various embodiments, the touch sensor comprises an accelerometer to detect a force applied to or a movement of the home appliance. In various embodiments, the touch sensor is a portable touch sensor, and the method further comprises installing the touch sensor in or on the home appliance.

In various embodiments, the method further includes operating a mobile computing device to select the state machine from a plurality of state machines for association with the predetermined touch event profile. In various versions, the plurality of state machines include a text message state machine configured to send a text message to a designated recipient. In various versions, the designated recipient is an emergency responder.

In various embodiments where the home appliance is a luminaire, the method further comprises operating a mobile computing device to configure a controller associated with the touch sensor to broadcast an instruction to one or more other luminaires in response to the determining. In various versions, the method may further including configuring the one or more other luminaires to emit light having selected properties based on the broadcast instruction.

In another aspect, a mobile computing device may include a wireless communication interface, one or more processors operably coupled with the wireless communication interface, and memory containing instructions that, in response to execution of the instructions by the one or more processors, cause the one or more processors to: receive, via the wireless communication interface, data indicative of a touch event at a home appliance; determine that the touch event satisfies a predetermined touch event profile; identify a state machine that is associated with the predetermined touch event profile; and initiate the state machine at the mobile computing device or at another remote device.

In various embodiments, to determine that the touch event satisfies the predetermined touch event profile, the memory further includes instructions that, in response to execution of the instructions by the one or more processors, cause the one or more processors to identify, from among a plurality of predetermined touch event profiles based on the data indicative of the touch event, the predetermined touch event profile.

In various embodiments, the data indicative of the touch event includes data indicative of correspondence between the touch event and the predetermined touch event profile. In various embodiments, the data indicative of the touch event includes an instruction to initiate the state machine at the mobile computing device or at the another remote device.

In various embodiments, the mobile computing further includes a touch screen. The memory may further include instructions that, in response to execution of the instructions by the one or more processors, cause the one or more processors to render on the touch screen a user interface operable to associate the predetermined touch event profile with the state machine. In various versions, the memory may include instructions that, in response to execution of the instructions by the one or more processors, cause the one or more processors to render the user interface in response to receipt, via the wireless communication interface from a luminaire, an indication of a touch event that does not already correspond to a predetermined touch event profile.

In various embodiments, to identify the state machine, the memory may further include instructions that, in response to execution of the instructions by the one or more processors, cause the one or more processors to select, from a plurality of state machines based on the data indicative of the touch event, the state machine. In various versions, the plurality of state machines includes a text message state machine configured to send a text message to a designated recipient. In various versions, the designated recipient is an emergency responder. In various versions, the plurality of state machines includes a state machine configured to activate a baby monitor.

In another aspect, a bridge for a lighting system may include a wireless communication interface, one or more processors operably coupled with the wireless communication interface, and memory. The memory may contain instructions that, in response to execution of the instructions by the one or more processors, cause the one or more processors to: receive, via the wireless communication interface from a lighting unit in the lighting system, data indicative of a touch event detected by the lighting unit; determine that the touch event satisfies a predetermined touch event profile; identify a state machine that is associated with the predetermined touch event profile; and cause initiation of the state machine at the lighting system bridge or at a mobile computing device.

The term "lighting fixture" or "luminaire" are used interchangeably herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources. A "multi-channel" lighting unit refers to an LED-based or non LED-based lighting unit that includes at least two light sources configured to respectively generate different spectrums of radiation, wherein each different source spectrum may be referred to as a "channel" of the multi-channel lighting unit.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers.

The term "network" as used herein refers to any interconnection of two or more devices (including controllers or processors) that facilitates the transport of information (e.g., for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present disclosure, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection). Furthermore, it should be readily appreciated that various networks of devices as discussed herein may employ one or more wireless, wire/cable, and/or fiber optic links to facilitate information transport throughout the network.

The term "user interface" as used herein refers to an interface between a human user or operator and one or more devices that enables communication between the user and the device(s). Examples of user interfaces that may be employed in various implementations of the present disclosure include, but are not limited to, switches, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

A "lighting control action" may be an instruction or command to emit light having a particular lighting property. For example, a lighting control action may cause a lighting unit or luminaire in which a lighting unit is installed to alter a property of light it emits, such as hue, saturation, brightness/intensity, temperature, dynamic sequence, and so forth. A lighting control action may also cause a lighting unit or luminaire in which a lighting unit is installed to turn on or off, to begin/end a dynamic lighting sequence, to invoke a predetermined lighting scene (e.g., romantic, relaxing, naptime, etc.), and so forth.

A "touch-controlled" home appliance is a home appliance such as a luminaire that may be controlled by touching one or more of its otherwise non-operative surfaces. This is opposed to operating a tactile switch, pulling a string, pressing a button, turning a knob, or operating other more traditional mechanisms to control a home appliance. That is not to say the home appliance cannot include tactile switches or other actuators as well; the touch-controlled home appliance may also be controlled by such traditional means. In some instances, a touch-controlled home appliance may be at least partially capacitive. A user's touch alters the capacitance in a manner detected by a controller, which controls operation of the home appliance accordingly. In other instances, an accelerometer may be employed to detect force applied to and/or movement of the home appliance. The measured force may be compared to one or more predetermined forces to determine what action to take. In addition to luminaires, home appliances may include kitchen appliances, bathroom appliances, or any other device commonly used in a home.

A "touch event profile" may be data indicative of a manner in which a touch-controlled home appliance is touched. In some embodiments, a touch event profile may include data indicative of an alteration in capacitance of a home appliance. In some embodiments, a touch event profile may include a recordation of an impulse response detected by an accelerometer. In some embodiments, a touch event profile may include data indicative of attenuation in a radio signal between a home appliance and a remote computing device, such as a lighting system bridge.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Home appliances such as luminaires and/or lighting units may be controlled with mobile computing devices such as smart phones, tablet computers and/or wearable computing devices. However, a user may not always have a mobile computing device handy when she wishes to change a lighting setting of a luminaire. Additionally, the fact that so many home appliances are (at least in some fashion) capable of communication opens up myriad possibilities for controlling those appliances and for performing various tasks. Thus, there is a need in the art to leverage the communication capabilities of various home appliances (or installed touch sensors) to perform a variety of tasks and applications, including lighting control. More generally, applicants have recognized and appreciated that it would be beneficial to associate touch events detected at home appliances to various state machines.

Figure 1:
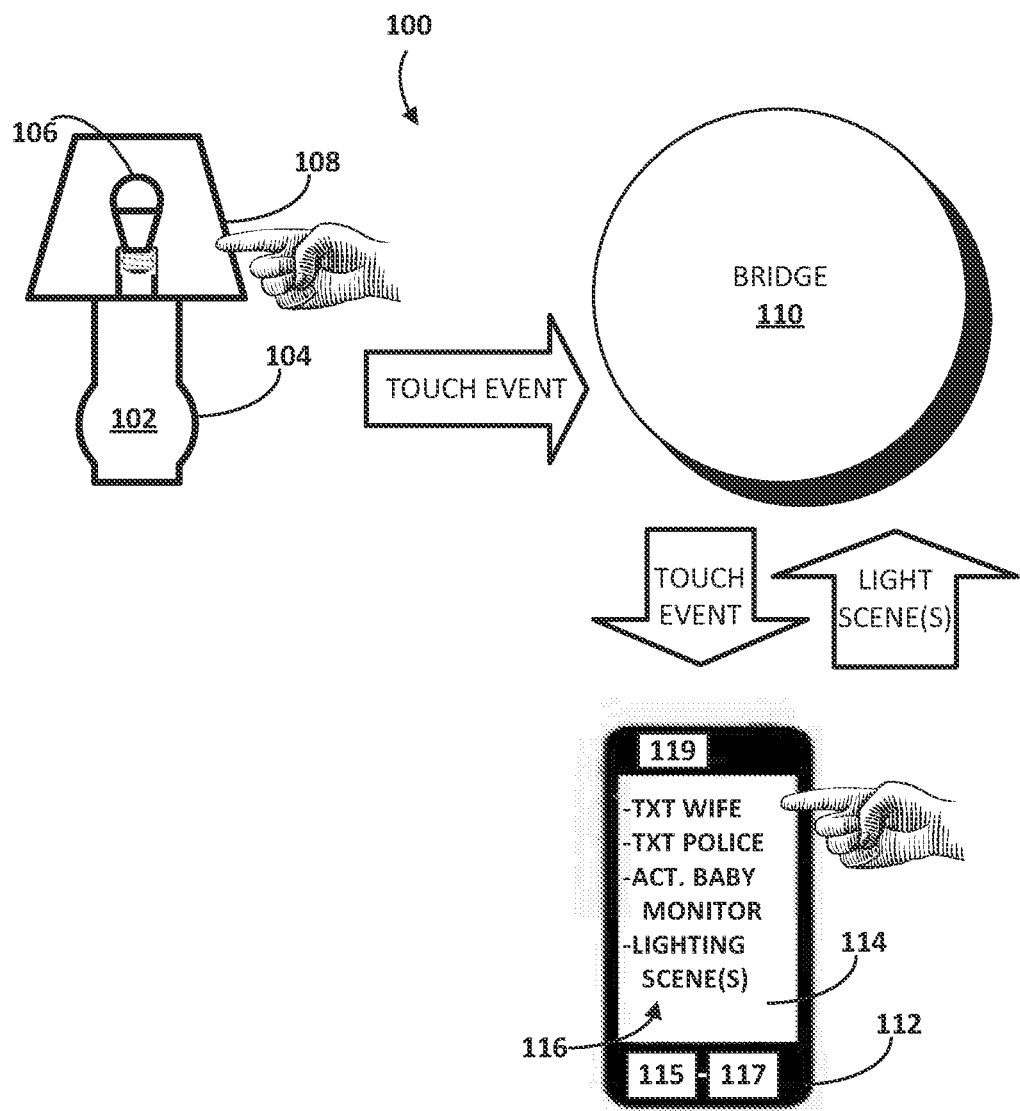
FIG. 1 illustrates one example of how a home appliance may be configured to cause initiation of a state machine in response to a touch event, in accordance with various embodiments.

Referring to FIG. 1, in one embodiment, a lighting system 100 may include at least one luminaire 102 and a lighting system bridge 110. Luminaire 102 may have an outer surface 104 that, as will be described below, may be touched in order to operate luminaire 102 for its primary function (e.g., emitting light) while also causing initiation of various types of state machines at various remote devices and/or home appliances. Luminaire 102 may include one or more installed lighting units 106. Lighting unit 106 may come in various forms, and may include various types of light sources, such as LEDs, incandescent lights, and so forth. Because luminaire 102 is formed as a tabletop standup luminaire, it includes a lampshade 108 that may also be touched to cause luminaire 102 to emit light and/or initiate one or more state machines.

Lighting system bridge 110 may be in network communication with one or more luminaires and/or lighting units, such as luminaire 102 and/or lighting unit 106 as well as with other home appliances. In various embodiments, lighting system bridge 110 may communicate with luminaires and/or lighting units using various wireless and wired mediums, as well as various communication technologies, including but not limited to Wi-Fi, Ethernet, ZigBee, coded light, radio frequency ("RF"), and so forth. In various embodiments, luminaires and/or lighting units may likewise be configured to communicate with lighting system bridge 110 and/or each other using similar mediums and technologies.

A user may be able to communicate with and/or operate lighting system bridge 110, luminaire 102 and/or lighting unit 106 using a computing device such as a mobile computing device 112. Mobile computing device 112 may come in various forms, such as a smart phone, tablet computer, wearable computer (e.g., smart glasses, smart watches, etc.), laptop computer, and so forth. Mobile computing device 112 may include various types of input and/or output devices, such as a touch screen 114.

Mobile computing device 112 may also include one or more processors 115 and memory 117 (e.g., RAM, ROM, flash, etc.) storing instructions that, when executed by one or more processors 115, cause one or more processors 115 to perform selected aspects of the present disclosure. Mobile computing device 112 may also include one or more wireless interfaces 119, which may enable communication using various technologies, including but not limited to Wi-Fi, radio frequency, Bluetooth, NFC, ZigBee, coded light, cellular, and so forth. It will be understood that, as a networked computing device, bridge 110 may also include components such as processors, memory, wireless interfaces, and so forth.

In various embodiments, a user may operate mobile computing device 112 to configure lighting system bridge 110, luminaire 102 and/or lighting unit 106 to perform various actions in response to a touch event being detected by luminaire 102 and/or lighting unit 106. Later, when luminaire 102 is touched in a similar manner, luminaire 102 may perform its primary function, which may be to emit light (e.g., energize one or more LEDs). Meanwhile, it may be determined whether the detected touch event satisfies a predetermined touch event profile. For example, a controller (see FIG. 2) incorporated in luminaire 102 and/or associated with another computing device such as lighting system bridge 110 may compare data indicative of the touch event (e.g., a signal) to one or more predetermined touch event profiles. If the detected touch event is "close enough" to any of the predetermined touch event profiles—e.g., within a standard deviation or a user-configured deviation of the predetermined touch event profile—then correspondence may be found. In response to correspondence being found, a state machine may be initiated at a computing device remote from the home appliance.

FIG. 1 depicts one example of how luminaire 102 may be configured to trigger a state machine in response to a touch event, in accordance with various embodiments. A user may touch luminaire 102, e.g., at lampshade 108, to cause data indicative of a touch event (e.g., a touch event profile) to be transmitted from luminaire 102 to bridge 110. Bridge 110 may in turn transmit the touch event profile to mobile computing device 112. Mobile computing device 112 may render, e.g., on touch screen 114, a user interface 116. In various embodiments, user interface 116 may be associated with an application (or "app") operating on mobile computing device 112 that enables a user to control various home appliances, such as one or more luminaires and/or lighting units forming lighting system 100. In various embodiments, user interface 116 may be operable by a user (e.g., as a drop down list) to select a particular state machine that is to be initiated in response to future touch events that correspond to the just-received touch event profile (which once recorded at luminaire 102, bridge 110 and/or mobile computing device 112 may become a "predetermined" touch event profile).

Various types of state machines may be available for association with one or more predetermined touch event profiles. For instance, one state machine may be a routine that is executed on a mobile computing device 112 to send a message, e.g., using simple messaging service ("SMS"), multimedia messaging service ("MMS"), email, and so forth, to a designated recipient. Designated recipients may include friends, family members such as a spouse or a child, a security company, emergency responders such as the police or fire department, and so forth.

In various embodiments, only touch events that are not likely to be mimicked accidentally (e.g., by a child or a pet, or in the ordinary course of use) may be associated with state machines that send communications to emergency responders or other authorities. For instance, a user may configure a home appliance such as luminaire 102 to initiate a state machine to text the police when luminaire 102 is tapped in a particular manner, such as a long touch or a "triple tap" (e.g., three taps in rapid succession). Meanwhile, luminaire 102 may also perform its primary function: emitting light. This may enable the user to clandestinely send an emergency text to the authorities while only appearing to turn on luminaire 102, which may avoid rousing an intruder's suspicions.

As another example, a first user may configure a lamp to send an instruction to the first user's mobile phone to a text to a second user with a message such as, "I'm home." When the first user returns home from the second user's house, the first user may turn on that lamp. Turning on that lamp may cause the lamp to initiate the state machine on the first user's phone, which in turn may text the second user. The second user would no longer need worry that the first user did not make it home.

A home appliance may cause initiation of a state machine on another device in various ways. In some embodiments, the home appliance may issue, e.g., over a network, an instruction to initiate the state machine. In other embodiments, the home appliance may provide data indicative of the touch event to a remote computing device. The remote computing device may then determine whether the detected touch event corresponds to a predetermined touch event profile, and if so, may initiate or cause initiation of a state machine.

Figure 2:
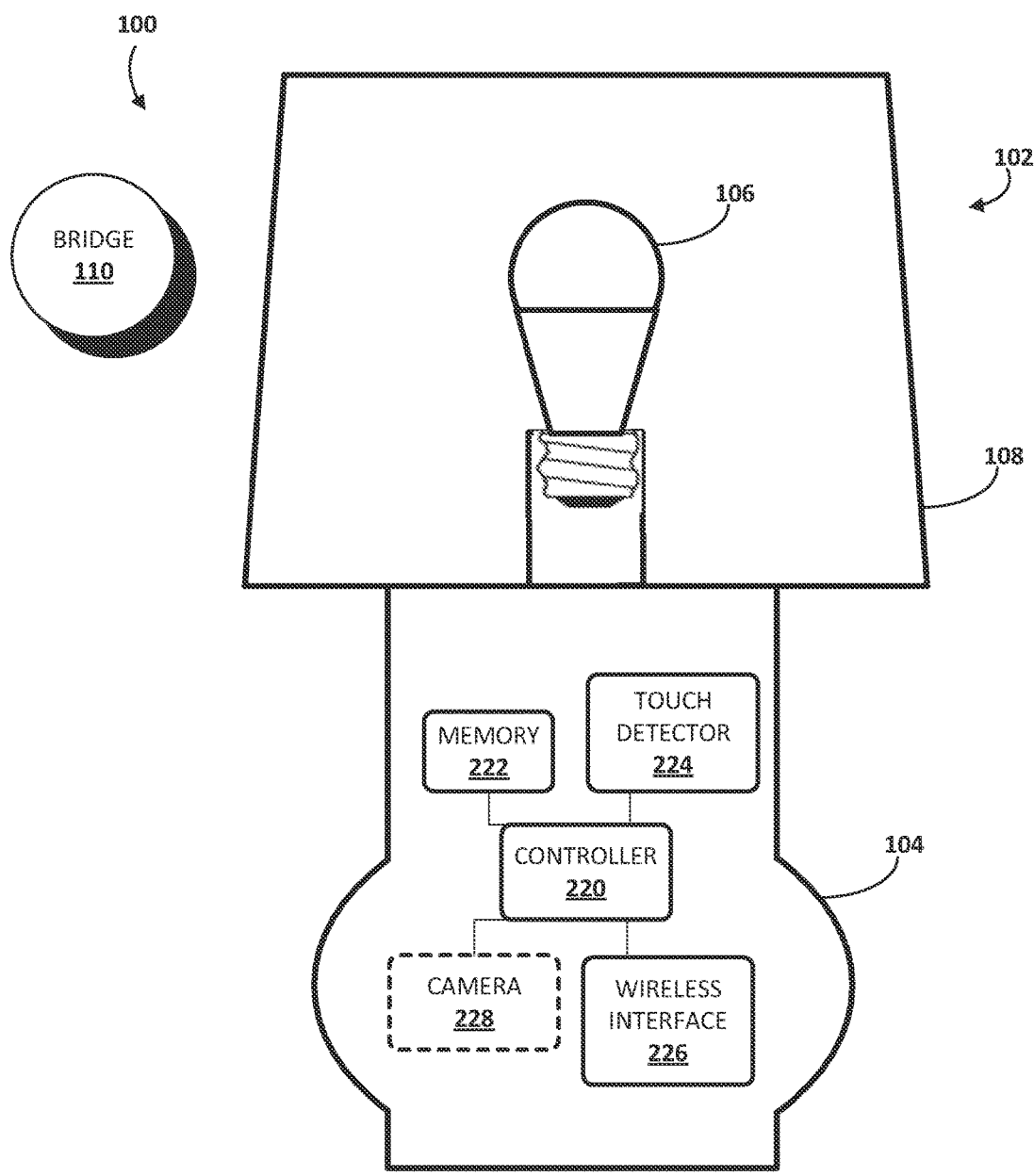
FIG. 2 schematically depicts components of an example home appliance in the form of a luminaire, in accordance with various embodiments.

FIG. 2 depicts an example home appliance in the form of luminaire 102, with various components that may be configured to perform selected aspects of the present disclosure. A controller 220 is depicted operably coupled with memory 222, a touch detector 224, a wireless communication interface 226 and, optionally, a camera 228. Memory 222 may come in various forms, including but not limited to RAM, ROM, flash memory, and so forth. Memory 222 may include instructions that when executed by controller 220, cause controller 220 to perform selected operations of the present disclosure.

Touch detector 224 may provide one or more signals indicative of touches to surface 104 and/or lampshade 108 to controller 220. Touch detector 224 may come in various forms. For instance, touch detector 224 may include an accelerometer that is configured to sense forces or movements of luminaire 102, e.g., that might be caused by a user's touch. In various embodiments, such a touch detector may be installed in luminaire 102 or in lighting unit 106. Additionally or alternatively, touch detector 224 may be a component configured to monitor capacitance of all or selected portions of luminaire 102. Controller 220 may determine whether changes in capacitance measured by touch detector 224 satisfy a threshold, and may act accordingly. Additionally or alternatively, touch detector 224 may monitor strength of a wireless signal between wireless communication interface 226 and a remote computing device, such as a lighting system bridge 110. As described above, any attenuation in that signal that satisfies a threshold may cause controller 220 to detect a touch event. In various embodiments, touch detector 224 may be a separate, portable component, such as an adaptor, that may be installed on/in a home appliance such as luminaire 102 to make the home appliance "touch-controlled."

Wireless communication interface 226 may allow controller 220 to exchange data through various wireless mediums with remote computing devices, such as bridge 110 and/or mobile computing device 112 of FIG. 1. Wireless communication interface 226 may come in various forms. In some embodiments, wireless communication interface 226 may communicate with remote computing devices directly or indirectly (e.g., through a local wireless network) using technologies such as BlueTooth, ZigBee, coded light, Wi-Fi, RFID, near field communication ("NFC"), and so forth. In some embodiments, wireless communication interface 226 may be configured to communicate with a remote computing device using technology described in the IEEE 802.15 standards (Wireless Personal Area Networks, or "WPAN"), including but not limited to visible light communication (802.15.7) and/or body area networks (802.15.6). In some embodiments where coded light is used to exchange data, camera 228 may act as a de facto wireless communication interface 226. Although only a single wireless communication interface 226 is depicted in FIG. 2, this is not meant to be limiting. In various embodiments, luminaire 102 (or in some cases, installed lighting unit 106) may include more than one wireless communication interface, and additionally may include one or more wired communication interfaces (not depicted in FIG. 2). For example, a single luminaire 102 may include a ZigBee interface, an NFC interface and/or a coded light interface.

Figure 3:
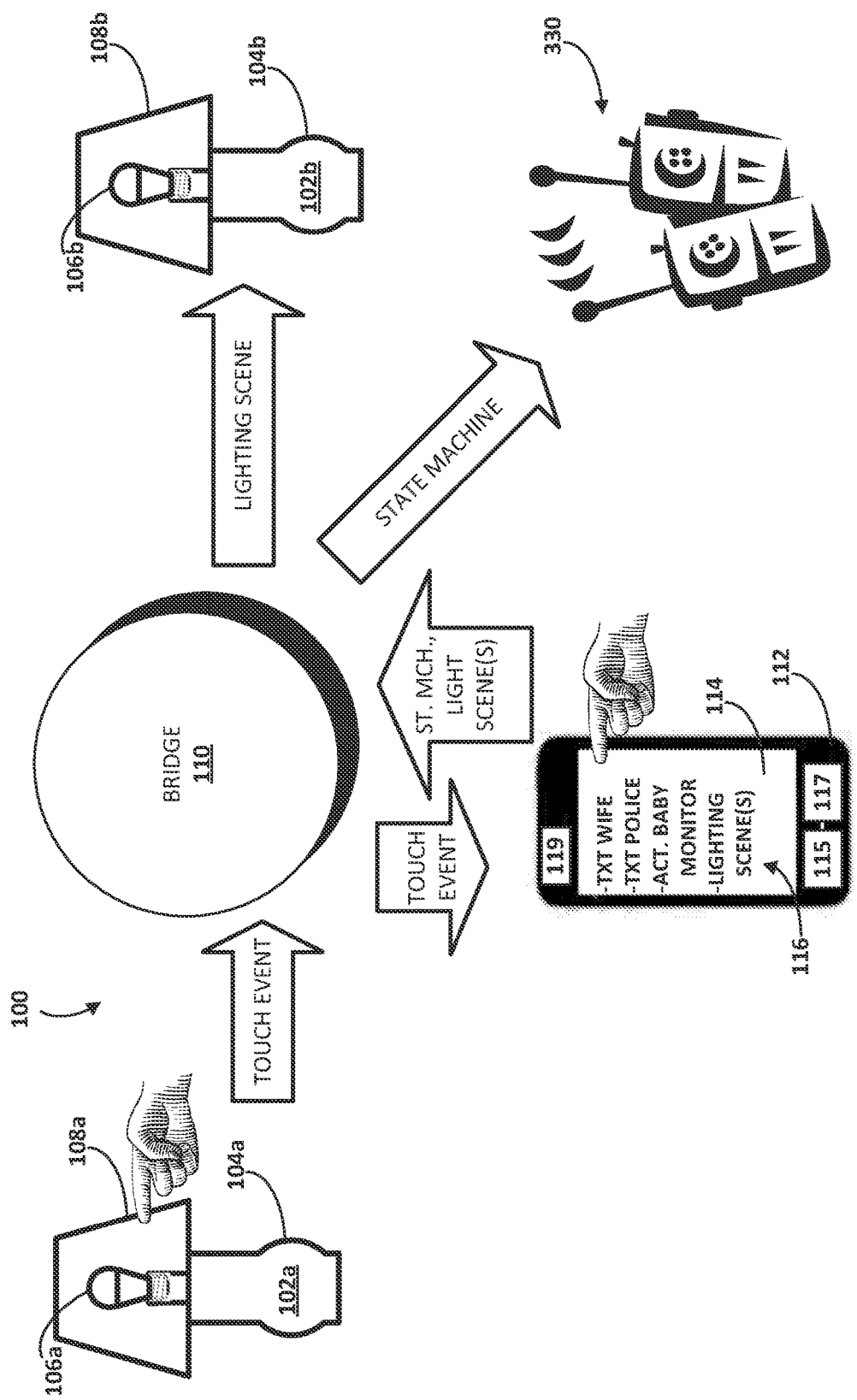
FIG. 3 illustrates an example of how a home appliance may be configured to cause initiation of multiple state machines, in accordance with various embodiments.

FIG. 3 depicts an example of how a home appliance in the form of a first luminaire 102a may be configured with mobile computing device 112 to transmit data indicative of touch events to one or more other home appliances, in accordance with various embodiments. In this example, other home appliances include a second luminaire 102b with a second surface 104b, a second installed lighting unit 106b and a second lampshade 108b, a baby monitor 330 and mobile computing device 112. Numerous other types of home appliances could also receive the touch event notification and could be configured to initiate various state machines.

Various types of state machines may be initiated to perform various actions. These actions may include but not limited to turning on/off sprinkler systems, locking/unlocking doors, turning on/off security systems, logging into/out of a computer system, updating social networking status, switching on lights in a particular area of a house, operating one or more lighting units/luminaires to emit a desired lighting scene, activating a favorite radio station or audio playlist, activating a particular channel on a television, and so forth.

In some embodiments, a user may interact with (e.g., touch) another home appliance to acknowledge that the user has witnessed initiation of a first state machine. For instance, assume the home appliance that initiated the state machine is a first luminaire, and the state machine causes a second luminaire to emit light having one or more selected properties. A user may observe the second luminaire emitting this selected light, and may tap the second luminaire to cause it to initiate another state machine that causes a signal to be sent to the first luminaire (e.g., using ZigBee, coded light, etc.) that the "message has been received." In some instances, the first luminaire may react to this acknowledgement by, for instance, turning itself off.

Configuration of first luminaire 102a may be similar to FIG. 1. On detection of a touch event at first luminaire 102a, data indicative of a touch event may be transmitted by first luminaire 102a to lighting system bridge 110. In other embodiments, e.g., where no lighting system is present, first luminaire 102a may transmit this data directly to mobile computing device 112. As described above with FIG. 1, a user may operate user interface 116 to select various state machines to be initiated upon detection of a corresponding touch event in the future. For instance, the user may select "ACT. BABY MONITOR" to cause baby monitor 330 to activate in response to future corresponding touch events. Assuming first luminaire 102a is a light in or near a child's room, a user may thereafter effectively activate baby monitor 330 by tapping on first luminaire 102a in a similar manner.

In various embodiments, a user may also be able to operate user interface 116 to associate various lighting scenes to-be-implemented by one or more other luminaires, such as second luminaire 102b, with various touch event profiles. In that way, when first luminaire 102a is touched in a particular manner, first luminaire 102a may cause other luminaires, e.g., directly or through bridge 110, to alter light they emit in a particular manner to create the desired lighting scene.

For instance, a user may "double-tap" (e.g., tap twice in rapid succession) first luminaire 102a to cause first luminaire 102a to transmit touch event data indicative of the double tap to bridge 110. Bridge 110 may in turn transmit this touch event data to mobile computing device 112. The user may then operate user interface 116 rendered by mobile computing device 112 to select one or more lighting scenes to associate with a double tap touch event detected at first luminaire 102a. One or more instructions indicative of this selected lighting scene (e.g., lighting control actions) may be transmitted to other light sources of lighting system 100, including second luminaire 102b.

Later, when first luminaire 102a is double tapped, it may transmit an instruction to other light sources of lighting system 100 (e.g., second luminaire 102b) to cause the user-selected lighting scene to be collectively emitted. For example, if the lighting scene selected for association with a double tap is "romantic," first luminaire 102a may emit soft light, and may cause other luminaires such as second luminaire 102b to emit similarly soft light. In some embodiments, first luminaire 102a may instruct other luminaires how to emit light. In other embodiments, first luminaire 102a may simply issue a notification of the double tap, and other lighting units (e.g., 102b) may react as previously configured by a user. Such inter-luminaire communications may occur over various wired and wireless mediums using various technologies, including but not limited to ZigBee, coded light, Bluetooth, Wi-Fi, and so forth.

Figure 4:
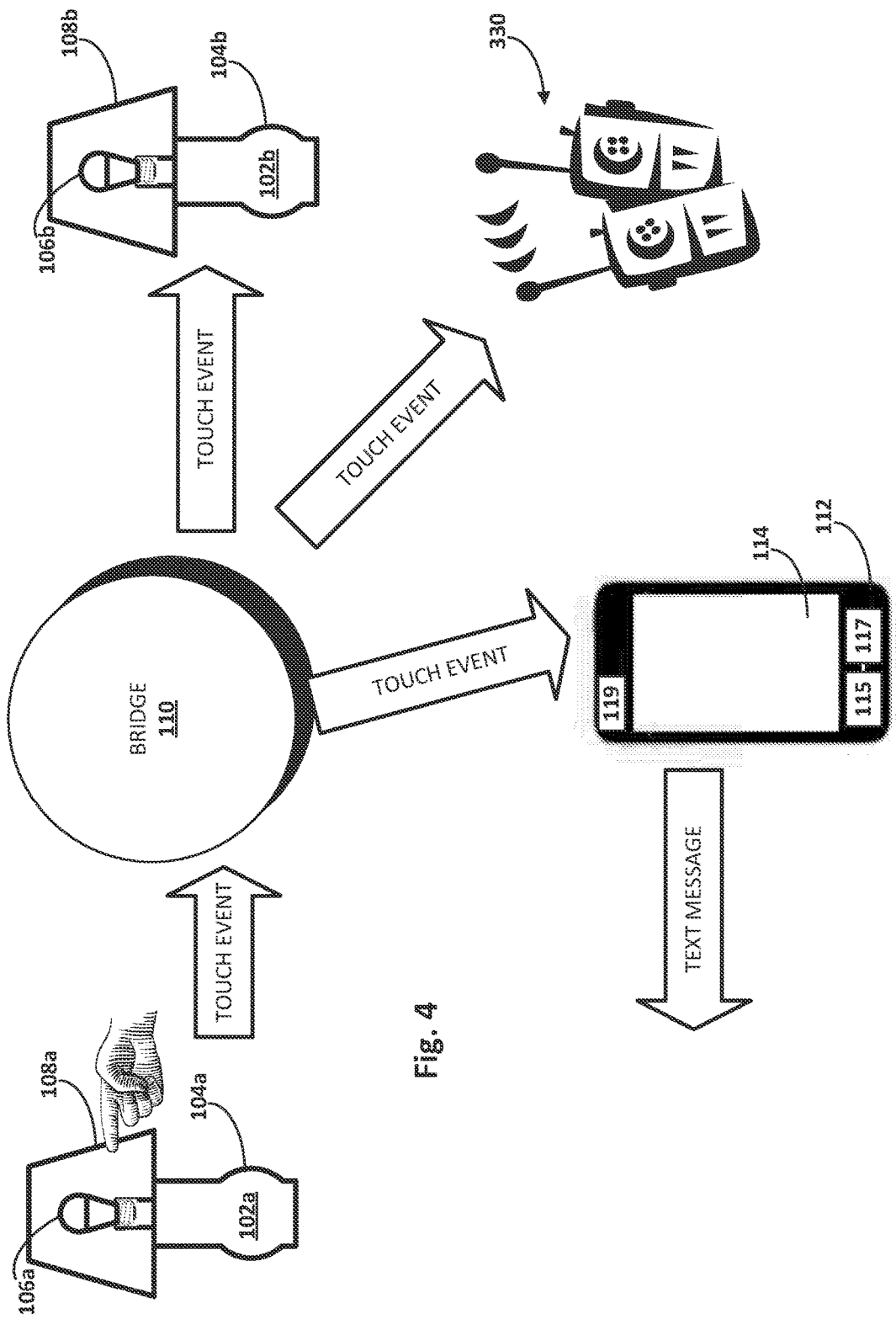
FIG. 4 illustrates the home appliance of FIG. 3 initiating a plurality of state machines at other home appliances and devices in response to a touch event, as well as causing such initiation in response to a later-detected touch event, in accordance with various embodiments.

An example of how a touch event detected at first luminaire 102a may trigger state machines at various other home appliances is depicted in FIG. 4. When first luminaire 102a is touched in a particular manner, it may perform its primary function (e.g., emit or cease emitting light) and, contemporaneously, may transmit data indicative of the detected touch event to lighting system bridge 110, e.g., using Wi-Fi, coded light, ZigBee, etc. In other embodiments, lighting system bridge 110 may be omitted, and first luminaire 102a may broadcast the data to a plurality of other home appliances directly (e.g., using Bluetooth, coded light or Wi-Fi Direct) or indirectly (e.g., using Wi-Fi or cellular communications).

Data indicative of the detected touch event (e.g., an indication that the touch event occurred or data that can be analyzed by another computing device to determine what touch event occurred) may arrive at one or more home appliances, such as second luminaire 102b, baby monitor 330 and/or mobile computing device 112. As described above, each of these home appliances may initiate a selected state machine in response to the received data. For instance, second luminaire 102b may emit light as part of a collective lighting scene, baby monitor 330 may begin (or cease) monitoring, and/or mobile computing device 112 may transmit a text message to a designated recipient.

Figure 5:
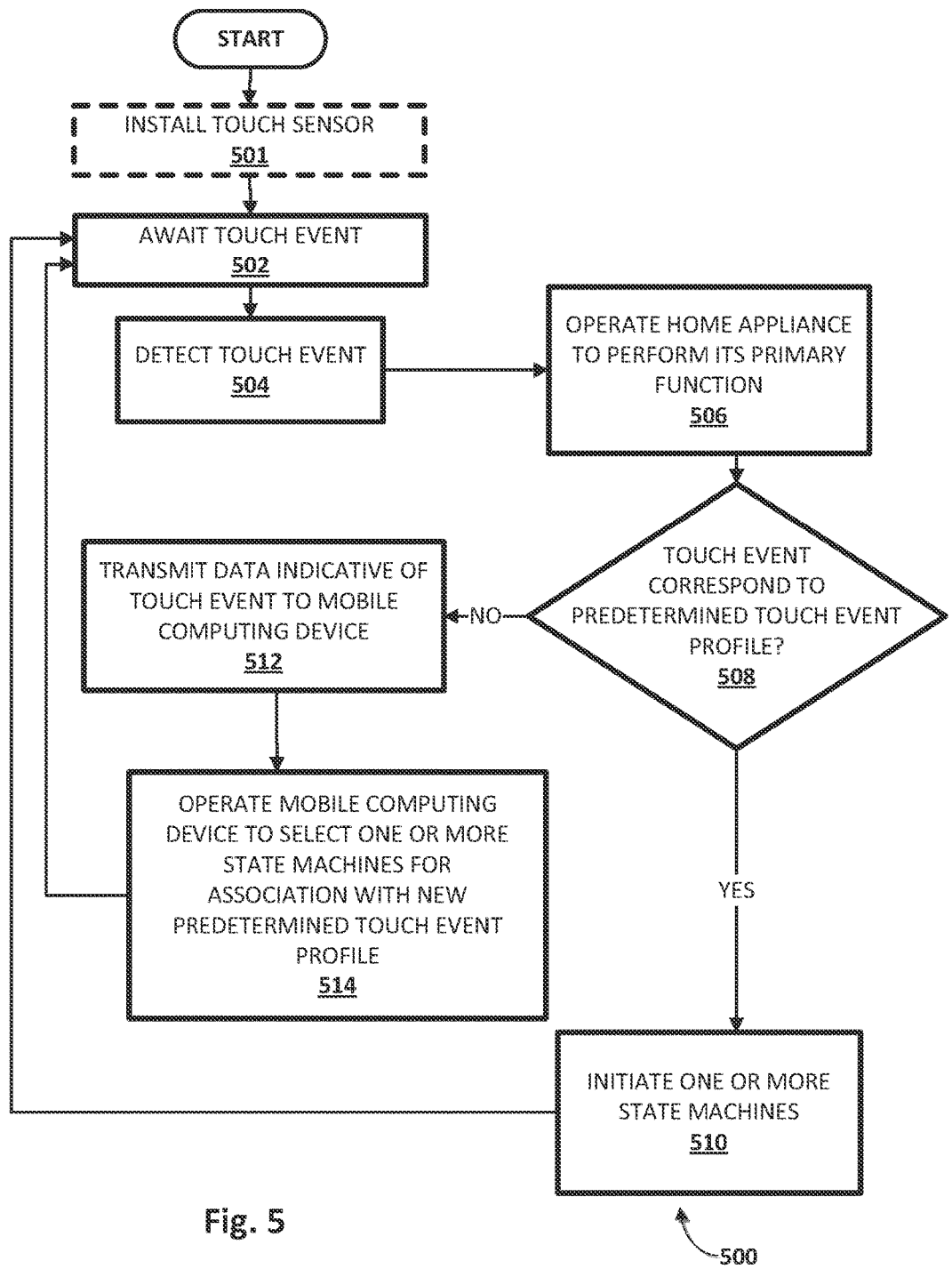
FIG. 5 depicts an example method of configuring a home appliance to cause initiation of one or more state machines in response to a touch event, in accordance with various embodiments.

FIG. 5 depicts an example method 500 of configuring a home appliance to initiate one or more state machines in response to a touch event, and for initiating one or more state machines in response to a detected touch event, in accordance with various embodiments. At optional (as indicated by the dashed outline) block 501, if no touch detection mechanism (e.g., touch detector 224) is installed in a home appliance such as a luminaire, then a touch detector may be installed. In some embodiments where the home appliance is a luminaire, a lighting unit (e.g., 106) configured with a touch-sensing mechanism such as an accelerometer, gyroscope and/or microphone may be installed in luminaire. This component may detect forces applied to or movement of the home appliance. For instance, an accelerometer may measure an impulse response. The measured impulse response may be analyzed by a controller (e.g., 220) to determine whether it corresponds to a predetermined touch event profile, which in this instance may be a predetermined impulse response. In other embodiments, various types of touch sensors may be installed on home appliances in various other ways.

At block 502, the home appliance may await a touch event. At block 504, the home appliance may detect a touch event. As mentioned above, a touch event may be detected in various ways. In some embodiments, an accelerometer may detect a force and/or movement applied to a surface of the home appliance. In some embodiments, a change in capacitance of a home appliance may be detected. In some embodiments, attenuation in a radio signal between a component of the home appliance and another remote device may be detected. In some embodiments, a microphone may be used, alone or in combination with other touch sensor components, to detect sound associated with a touch event.

At block 506, the home appliance may be operated to perform its primary function. As noted above, if the home appliance is a luminaire or lighting unit, it may be operated to emit (or cease emitting) light. If the home appliance is a kitchen appliance, it may be operated to provide heat, chop or mix food and/or ingredients, and so forth. If the home appliance is a bathroom appliance, it may be operated to trim hair, brush teeth, apply makeup, dry hair, and so forth.

At block 508, it may be determined, e.g., by a controller associated with the home appliance itself or by a remote device (e.g., bridge 110 or mobile computing device 112), whether the touch event corresponds to a predetermined touch event profile. If the answer at block 508 is yes, then method 500 may proceed to block 510. At block 510, one or more state machines associated with the predetermined touch event profile to which the detected touch event corresponded may be initiated. For instance, the home appliance or another computing device (e.g., bridge 110, mobile computing device 112) may broadcast an indication that the detected touch event satisfies a predetermined touch event profile, and one or more home appliances may react by initiating various state machines. For example, mobile computing device 112 may transmit a text message to a designated recipient, baby monitor 330 may begin (or cease) monitoring, and so forth. Method 500 may then proceed back to block 502.

If the answer at block 508 is no, then method 500 may proceed to block 512. At block 512, data indicative of the detected touch event may be transmitted, e.g., by the home appliance, to a remote computing device such as mobile computing device 112. This transmission may be direct (e.g., using Bluetooth, Wi-Fi Direct, coded light, etc.) or indirect (e.g., through bridge 110 or through a Wi-Fi router).

At block 514, a user may operate mobile computing device 112 to select one or more state machines (e.g., text designated recipient, text police, start baby monitor, lock doors, start sprinkler system, etc.) for association with a new predetermined touch event profile that is stored based on the detected touch event profile. In some embodiments, where a user desires that multiple home appliances initiate state machines in response to subsequent detection of the touch event, the user may operate mobile computing device 112 to transmit instructions to various home appliances (directly or indirectly) to initiate various state machines in response to a message (e.g., broadcast by the home appliance) that the touch event has been subsequently detected. Method 500 may then proceed back to block 502.

As noted above, various predetermined touch event profiles may be associated with various state machines. A single home appliance may initiate one state machine in response to a detected touch event that satisfies a first predetermined touch event profile, and may initiate another state machine in response to a detected touch event that satisfies a second predetermined touch event profile. Thus, for instance, tapping a luminaire softly may cause only that luminaire to alter one or more properties of light it emits (e.g., increasing brightness, changing color, etc.). Tapping the same luminaire with greater force may cause not only that luminaire to alter one or more properties of light emit, but may also cause the luminaire to issue an instruction to other nearby lighting units to alter one or more properties light they emit in a similar or otherwise complimentary manner.

In some embodiments, particularly where touch detector 224 includes an accelerometer, a direction in which a home appliance is touched may also dictate which remote home appliances initiate state machines. For instance, assume a luminaire is touched with a force that is representable by a three-dimensional vector, and that the luminaire responsively emits a first lighting scene. Other luminaires that lie along or within a predetermined distance of an extension of that vector may also receive instructions to emit the first lighting scene. In some embodiments, the vector's amplitude may be proportionate to a force with which the luminaire is tapped. Thus, if a luminaire is tapped softly, only nearby luminaires along the vector may contribute to illumination of a lighting scene. If the luminaire is tapped with greater force, the vector may extend further such that luminaires further away along the vector may also contribute to illumination of the lighting scene.

In addition to touch events, various other types of forces may be detected by a home appliance, and the home appliance may initiate (or not initiate) one or more state machines in response. For instance, in various embodiments, a home appliance may be equipped with a sensor (e.g., accelerometer, gyroscope, microphone, camera, or another device configured to measure vibrations) that can detect vibrations or other movements of the home appliance. These detected vibrations or movements may be analyzed, e.g., by controller 220, bridge 110 and/or mobile computing device 112, to determine whether, for instance, an earthquake of at least a threshold magnitude has occurred. If so, the home appliance may issue an instruction to another home appliance and/or mobile computing device 112 to initiate an appropriate state machine. For instance, mobile computing device 112 may transmit a text to a spouse saying, "call me ASAP," or a text to an emergency response saying, "I need help." Additionally or alternatively, a home appliance such as a luminaire may be configured to detect when it has been knocked down (e.g., by an intruder, a pet or a child), hit with an object (e.g., with a ball or another toy), and so forth, and may respond accordingly.

In some embodiments, the home appliance may include a microphone or another similar sensor configured to detect approaching or passing footsteps. In such case, the home appliance may be configured to itself emit light (e.g., if it is a luminaire) or to cause other nearby home appliances (e.g., luminaires) to emit light.

In some embodiments, a game may be implemented using disclosed techniques. For instance, a memory game may make use of a plurality of luminaires and/or lighting units in a child's room. The plurality of luminaires/lighting units may illuminate in a particular sequence (e.g., turning on and off, and/or emitting different colors). Once the sequence is complete, the child may attempt to tap on the luminaires/lighting units in the same sequence. In some embodiments, each luminaire/lighting unit may notify a lighting system bridge or another remote computing device of the child's tap. The lighting system bridge or remote computing device may thereby track the child's tapped sequence to verify whether the child has correctly recreated the original sequence. If the child successfully recreates the sequence, the plurality of luminaires/lighting units may reward the child with a celebratory sequence, as well as present the child with a more challenging sequence. In some embodiments, another computing device such as mobile computing device 112 may provide auditory feedback. As another variation, the luminaires/lighting units may emit various colors, and the child may attempt to tap groups of luminaires/lighting units that emitted the same color.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

It should also be understood that, unless clearly indicated to the contrary, in any methods claimed herein that include more than one step or act, the order of the steps or acts of the method is not necessarily limited to the order in which the steps or acts of the method are recited.

Reference numerals appearing between parentheses in the claims, if any, are provided merely for convenience and should not be construed as limiting the claims in any way.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method, comprising:
   detecting a touch event at a touch sensor associated with a home appliance comprising a luminaire;
   operating the home appliance to perform its primary function in response to the detecting of the touch event, the primary function comprising controlling lighting of the luminaire;
   determining that data transmitted from the touch sensor regarding the touch event satisfies a predetermined touch event profile associated with a secondary function to be performed at a computing device separate and remote from the home appliance, the secondary function being different than the primary function; and
   initiating the secondary function at the computing device in response to receiving the data from the touch sensor after the determining step.

2. The method of claim 1, wherein initiating the secondary function comprises issuing, by a controller associated with the touch sensor over a network in response to the determining, an instruction to initiate the secondary function.

3. The method of claim 2, wherein the issuing comprises transmitting one or more instructions to one or more other luminaires.

4. The method of claim 3, wherein the transmitting comprises transmitting using ZigBee, radio frequency communication, or coded light.

5. The method of claim 2, wherein the issuing comprises transmitting the instruction to a lighting system bridge.

6. The method of claim 2, wherein the issuing comprises transmitting the instruction to a mobile computing device.

7. The method of claim 1, wherein operating the home appliance to perform its primary function comprises energizing one or more light sources installed in the luminaire.

8. The method of claim 1, wherein the touch sensor comprises an accelerometer to detect a force applied to or a movement of the home appliance.

9. The method of claim 1, wherein the touch sensor is a portable touch sensor, and the method further comprises installing the touch sensor in or on the home appliance.

10. The method of claim 1, further comprising operating a mobile computing device to select the secondary function from a plurality of functionalities for association with the predetermined touch event profile.

11. A mobile computing device, comprising:
   a wireless communication interface;
   one or more processors operably coupled with the wireless communication interface; and
   memory containing instructions that, in response to execution of the instructions by the one or more processors, cause the one or more processors to:
   receive, via the wireless communication interface, data indicative of a touch event at a home appliance comprising a luminaire separate and remote from the mobile computing device, the home appliance configured to perform a primary function in response to the touch event;
   determine that the touch event satisfies a predetermined touch event profile associated with a secondary function at the mobile computing device or at another remote device, the secondary function to be performed separate and remote from the home appliance, wherein the secondary function is different than the primary function;

identify the secondary function that is associated with the predetermined touch event profile; and initiate the secondary function at the mobile computing device or at another remote device in response to receiving the data from the luminaire after it is determined that the touch event satisfies the predetermined touch event profile.

12. The mobile computing device of claim 11, wherein to determine that the touch event satisfies the predetermined touch event profile, the memory further includes instructions that, in response to execution of the instructions by the one or more processors, cause the one or more processors to identify the predetermined touch event profile from among a plurality of predetermined touch event profiles based on the data indicative of the touch event.

13. The mobile computing device of claim 11, wherein the data indicative of the touch event includes data indicative of correspondence between the touch event and the predetermined touch event profile.

14. The mobile computing device of claim 11, wherein the data indicative of the touch event includes an instruction to initiate the secondary function at the mobile computing device or at the another remote device.

15. The mobile computing device of claim 11, further comprising a touch screen, wherein the memory further includes instructions that, in response to execution of the instructions by the one or more processors, cause the one or more processors to render on the touch screen a user interface operable to associate the predetermined touch event profile with the secondary function.

16. The mobile computing device of claim 15, wherein the memory further includes instructions that, in response to execution of the instructions by the one or more processors, cause the one or more processors to render on the touch screen the user interface in response to receipt, via the wireless communication interface from a luminaire, an indication of a touch event that does not already correspond to a predetermined touch event profile.

17. The mobile computing device of claim 11, wherein to identify the secondary function, the memory further includes instructions that, in response to execution of the instructions by the one or more processors, cause the one or more processors to select the secondary function from a plurality of functionalities based on the data indicative of the touch event.

18. The mobile computing device of claim 17, wherein the plurality of functionalities includes a text message functionality configured to send a text message to a designated recipient.

19. The mobile computing device of claim 18, wherein the designated recipient is an emergency responder.

20. A bridge for a lighting system, comprising:

a wireless communication interface;

one or more processors operably coupled with the wireless communication interface; and memory containing instructions that, in response to execution of the instructions by the one or more processors, cause the one or more processors to:

receive, via the wireless communication interface from a lighting unit in the lighting system, data indicative of a touch event detected by the lighting unit, the lighting unit configured to perform a primary function in response to the touch event;

determine that the touch event satisfies a predetermined touch event profile associated with a secondary function being separate and remote from the lighting unit;

identify the secondary function that is associated with the predetermined touch event profile; and cause initiation of the secondary function at the lighting system bridge or at a mobile computing device in response to receiving data from the lighting unit after it is determined that the touch event satisfies the predetermined touch event profile, wherein the secondary function is different than the primary function.

* * * * *